United States Patent
Cheng

(10) Patent No.: US 11,081,640 B2
(45) Date of Patent: Aug. 3, 2021

(54) MAGNETIC RANDOM ACCESS MEMORY BOTTOM ELECTRODE SELF-ALIGNED TO UNDERLYING INTERCONNECT STRUCTURES

(71) Applicant: International Business Machines Corporation, Armonk, NY (US)

(72) Inventor: Kangguo Cheng, Schenectady, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 30 days.

(21) Appl. No.: 16/238,243

(22) Filed: Jan. 2, 2019

(65) Prior Publication Data

US 2020/0212292 A1 Jul. 2, 2020

(51) Int. Cl.
*H01L 43/02* (2006.01)
*H01L 43/12* (2006.01)
*H01L 43/10* (2006.01)
*H01L 27/22* (2006.01)

(52) U.S. Cl.
CPC .............. *H01L 43/02* (2013.01); *H01L 43/10* (2013.01); *H01L 43/12* (2013.01); *H01L 27/222* (2013.01)

(58) Field of Classification Search
CPC ......... H01L 43/02; H01L 43/12; H01L 43/10; H01L 27/222
See application file for complete search history.

(56) References Cited

U.S. PATENT DOCUMENTS

| | | | |
|---|---|---|---|
| 7,582,893 B2 | 9/2009 | Sokolik et al. | |
| 7,629,182 B2 | 12/2009 | Wise | |
| 8,168,538 B2 | 5/2012 | Chen et al. | |
| 8,237,149 B2 | 8/2012 | Oh et al. | |
| 8,274,110 B2 | 9/2012 | Sandhu et al. | |
| 8,541,767 B2 | 9/2013 | Fang et al. | |
| 8,680,500 B2 | 3/2014 | Oh et al. | |
| 9,711,713 B1* | 7/2017 | Chou | H01L 43/08 |
| 9,847,477 B2 | 12/2017 | Huang et al. | |
| 2018/0006085 A1 | 1/2018 | Chuang et al. | |
| 2018/0151213 A1 | 5/2018 | Yu | |
| 2018/0226452 A1* | 8/2018 | Nam | H01L 43/02 |

OTHER PUBLICATIONS

Fang et al., "Phase Change Random Access Memory Devices with Nickel Silicide and Platinum Silicide Electrode Contacts for Integration with CMOS Technology," Journal of the Electrochemical Society 158.3, 2011, pp. H232-H238.

* cited by examiner

*Primary Examiner* — Steven H Loke
*Assistant Examiner* — Juanita B Rhodes
(74) *Attorney, Agent, or Firm* — Cantor Colburn LLP; Erik Johnson

(57) ABSTRACT

Embodiments of the invention are directed to a method of forming a bottom electrode of a magnetic tunnel junction (MTJ) storage element. A non-limiting example of the method includes forming the bottom electrode of the MTJ storage element such that the bottom electrode is communicatively coupled to an interconnect structure through an in-situ interface, wherein the in-situ interface includes an interface between a bottom surface of the bottom electrode and a top surface of the interconnect structure. A top surface of the bottom electrode is configured to couple to a bottom end of a MTJ stack, and the bottom electrode includes a semiconductor and metal alloy.

20 Claims, 12 Drawing Sheets

MAGNETIC RANDOM ACCESS MEMORY BOTTOM ELECTRODE SELF-ALIGNED TO UNDERLYING INTERCONNECT STRUCTURES

BACKGROUND

The present invention relates in general to fabrication methodologies and resulting structures for semiconductor devices. More specifically, the present invention relates to fabrication methodologies and resulting structures for forming magnetic random access memory (MRAM) bottom electrodes that are self-aligned to the underlying interconnect structures of the integrated circuit (IC).

ICs are fabricated in a series of stages, including front-end-of-line (FEOL) stages, middle-of-line (MOL) stages and back-end-of-line (BEOL) stages. The process flows for fabricating modern ICs are often identified based on whether the process flows fall in the FEOL stages, the MOL stages, or the BEOL stages. Generally, the FEOL stages are where device elements (e.g., transistors, capacitors, resistors, etc.) are patterned in the semiconductor substrate/wafer. The FEOL stages (or logical layers) include wafer preparation, isolation, and gate patterning, along with the formation of wells, source/drain (S/D) regions, extension junctions, silicide regions, and liners. The MOL stages (or functional layers) typically include process flows for forming the contacts and other structures that couple to active regions (e.g., gate/source/drain) of the FEOL device elements. Networks of interconnect structures (e.g., conductive lines and vias) are formed above these logical and functional layers during the BEOL stage to complete the IC.

MRAM can be formed from memory structures such as magnetic tunnel junction (MTJ) stacks, which can be embedded in BEOL interconnect structures. The MTJ stack can be electrically accessed through top and bottom contacts/electrodes that are coupled to top and bottom ends, respectively, of the MJT stack.

SUMMARY

Embodiments of the invention are directed to a method of forming a bottom electrode of a magnetic tunnel junction (MTJ) storage element. A non-limiting example of the method includes forming the bottom electrode of the MTJ storage element such that the bottom electrode is communicatively coupled to an interconnect structure through an in-situ interface, wherein the in-situ interface includes an interface between a bottom surface of the bottom electrode and a top surface of the interconnect structure. A top surface of the bottom electrode is configured to couple to a bottom end of a MTJ stack, and the bottom electrode includes a semiconductor and metal alloy.

Embodiments of the invention are directed to a method of forming a bottom electrode of a MTJ storage element. A non-limiting example of the method include depositing a layer of semiconductor material over a layer of a multi-layered integrated circuit (IC) layer and an exposed surface of an interconnect structure in the layer of the multi-layered IC. The bottom electrode of the MTJ storage element is formed by initiating a self-aligned chemical reaction between a metal of the interconnect structure and a portion of the layer of semiconductor material that is over the exposed surface of the interconnect structure. A top surface of the bottom electrode is configured to couple to a bottom end of a MTJ stack, and the bottom electrode includes a semiconductor and metal alloy.

Embodiments of the invention are directed to a bottom electrode structure of a MTJ storage element. A non-limiting example of the bottom electrode structure includes a bottom electrode communicatively coupled to the interconnect structure through an in-situ interface, wherein the in-situ interface includes an interface between a bottom surface of the bottom electrode and a top surface of the interconnect structure. The bottom surface of the bottom electrode and the top surface of the interconnect structure that form the in-situ interface have not been exposed to an ambient. A top surface of the bottom electrode is configured to couple to a bottom end of a MTJ stack, and the bottom electrode includes a semiconductor and metal alloy.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 1-8B depict a portion of an IC structure after fabrication operations for forming MTJ memory elements having bottom electrodes thereon in accordance with embodiments of the invention, in which:

FIG. 1 depicts a cross-sectional view of a semiconductor wafer after fabrication operations according to embodiments of the invention;

FIG. 2 depicts a cross-sectional view of a semiconductor wafer after fabrication operations according to embodiments of the invention;

FIG. 3 depicts a cross-sectional view of a semiconductor wafer after fabrication operations according to embodiments of the invention;

FIG. 4 depicts a cross-sectional view of a semiconductor wafer after fabrication operations according to embodiments of the invention;

FIG. 8B depicts a cross-sectional view of a semiconductor wafer after fabrication operations according to embodiments of the invention.

DETAILED DESCRIPTION

Figure 1:
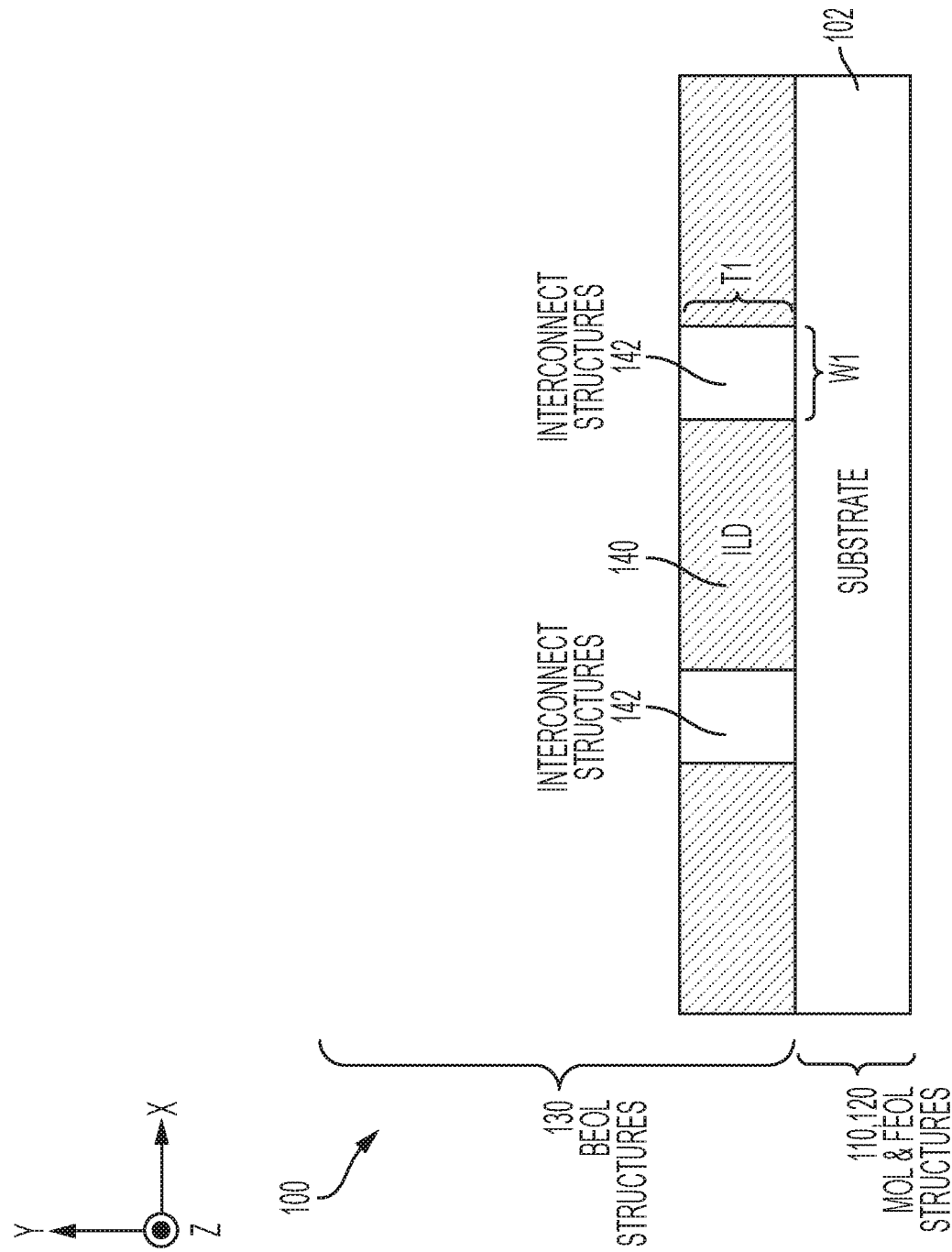

It is understood in advance that, although this description includes a detailed description of the formation and resulting structures for a specific type of embedded MTJ stack, implementation of the teachings recited herein are not limited to the particular type of embedded memory element or IC architecture described herein. Rather embodiments of the present invention are capable of being implemented in conjunction with any other type of memory element or IC architecture, now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the fabrication of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, magnetic random access memory (MRAM) is a non-volatile memory that combines a magnetic device with standard silicon-based microelectronics to achieve the combined attributes of non-volatility, high-speed read/write operations, high read/write endurance and data retention. A popular type of MRAM is based on the magnetoresistive effect, whereby a change to certain magnetic states of the MRAM storage element (or "bit") results in a change to the storage element's resistance, hence the name "Magnetoresistive" RAM. The main MRAM storage element is known as a magnetic tunnel junction (MTJ) storage element. A basic MTJ stack includes a free layer and a fixed/reference layer, each of which includes a magnetic material. The free and reference layers are separated by a non-magnetic insulating tunnel barrier. The free layer and the reference layer are magnetically de-coupled by the tunnel barrier. The free layer has a variable magnetization direction, and the reference layer has an invariable magnetization direction. A wide variety of layers and elements (e.g., an MTJ cap, multiple free/reference layers, etc.) can be included in an MTJ stack.

An MTJ stack stores information by switching the magnetization state of the free layer. When the free layer's magnetization direction is parallel to the reference layer's magnetization direction, the MTJ is in a low resistance state. Conversely, when the free layer's magnetization direction is anti-parallel to the reference layer's magnetization direction, the MTJ is in a high resistance state. The difference in resistance of the MTJ can be used to indicate a logical "1" or "0," thereby storing a bit of information. The tunneling magnetoresistance (TMR or MR) of an MTJ determines the difference in resistance between the high and low resistance states. A relatively high difference between the high and low resistance states facilitates read operations in the MRAM.

As previously described herein, MTJ stacks can be embedded in interconnect structures of the IC. Typically, the interconnect structures include wires and vias. For a variety of reasons, it is desirable to not place the MTJ stack directly on an interconnect structure of the IC. In general, the MTJ is a somewhat fragile element that must be carefully interfaced with other IC structures. For example, the wires and vias that form the interconnect structures are typically formed from copper and/or cobalt. Cobalt is a magnetic material, and copper is known to diffuse easily during IC fabrication operations. Accordingly, in order to minimize the potential for the magnetic and diffusion properties of cobalt and copper, respectively, the MTJ stack is typically coupled to the interconnect structures through newly deposited top and bottom contacts/electrodes (e.g., TiN (titanium nitride) or TaN (tantalum nitride), or ruthenium (Ru)). In known MRAM fabrication operations, the BEOL metal (e.g., cobalt (Co) or copper (Cu), or nickel (Ni), or other suitable metals) is recessed then re-filled with the top/bottom electrode material (e.g., TiN or TaN or Ru), followed by a polishing operation to ensure that the TiN or TaN electrode provides a flat (or uniform) surface on which the MTJ stack will be deposited. Such known MRAM fabrication operations have shortcomings in that they are complicated and result in non-uniform Co or Cu recesses due to the need to use timed etch processes to recess the Co or Cu BEOL metal.

Turning now to an overview of aspects of the present invention, embodiments of the invention address the shortcomings of the prior art by providing fabrication methodologies and resulting structures for embedding MTJ stacks into interconnects of an IC, wherein each MTJ stack includes a bottom electrode that is formed without the need to recess metals in the underlying interconnect structure. In embodiments of the invention, the MTJ bottom electrode is a compound/alloy formed from a combination of a semiconductor and a metal, wherein the metal component of the semiconductor/metal alloy is provided by the metal of the underlying interconnect structure, and wherein the semiconductor component of the semiconductor/metal alloy is provided by a layer of the semiconductor material that has been deposited over the interconnect structure. In embodiments of the invention, after the interconnect structure (e.g., a Co via) has been formed in a low-k interlayer dielectric (ILD) of the IC, a uniform semiconductor layer (e.g., Si) is deposited on the interconnect structure and the flat surface of low-k dielectric. A low thermal budget anneal is performed so that the semiconductor material (e.g., Si) of the deposited semiconductor layer reacts with the metal (e.g., Co) of the underlying interconnect structure to form a semiconductor/metal compound/alloy (e.g., a silicide of CoSi) region that will function as the MTJ bottom electrode. More specifically, the low thermal budget anneal causes at least some of the semiconductor material of the deposited semiconductor layer to diffuse into and react with the metal of the interconnect structure, while also causing at least some of the metal of the interconnect structure to diffuse into and react with the semiconductor material of the deposited semiconductor layer. In embodiments of the invention, the deposited semiconductor layer can be any suitable semiconductor material, including but not limited to amorphous Si, Si, Ge, and SiGe. In embodiments of the invention, the interconnect structure can be any suitable metal, including but not limited to Co and Cu. Accordingly, in embodiments of the invention, the MTJ bottom electrode that results from the low thermal budget anneal can be any suitable semiconductor/metal alloy/compound, including but not limited to a silicide, a germanide, and combinations thereof.

The novel process utilized to form the MTJ bottom electrode is described herein as a reverse silicide process in that, unlike known silicide formation processes in which metal is deposited on silicon, the reverse silicide process described herein deposits a layer of Si semiconductor material over both the metal interconnect structure and the region of low-k ILD material in which the interconnect structure is formed. Accordingly, when the low thermal budget anneal is applied to initiate the reverse silicide MTJ bottom electrode fabrication process, the resulting MTJ bottom electrode is self-aligned in that the chemical reaction between the Si semiconductor material and the interconnect structure metal only proceeds in the portion of the Si semiconductor material that is over the interconnect structure metal, and does not proceed in the portions of the Si semiconductor material that are over the low-k ILD layer/region of the IC. In embodiments of the invention, the reverse silicide process can be well-controlled in that the reaction of the semiconductor material (e.g., Si) of the deposited semiconductor layer with the metal (e.g., Co) of the underlying interconnect structure only occurs during the anneal and in the areas in which semiconductor material is over metal. Accordingly, the reverse silicide process in accordance with aspects of the present invention is highly selective to and self-aligned with the footprint of the underlying interconnect structure.

The reverse silicide process is self-limited and will continue until either all of the metal in the interconnect structure is consumed or until the semiconductor material in the portion of the semiconductor layer that is positioned over the metal interconnect structure is consumed. In aspects of the invention, the thickness of the deposited semiconductor layer is considerably less than the thickness of the underlying interconnect structure (e.g., a metal via). Accordingly, after the reverse silicide process is initiated by the low thermal budget anneal, the semiconductor/metal reaction of the reverse silicide process stops when the semiconductor material in the portion of the semiconductor layer that is positioned over the metal interconnect structure is consumed. Consequently, while the lateral dimensions of the MTJ bottom electrode that results from the novel reverse silicide process are determined by the footprint of the underlying interconnect structure, the thickness dimensions of the MTJ bottom electrode that results from the novel reverse silicide process can be tuned by adjusting the thickness of the deposited semiconductor layer.

The interface between the MTJ bottom electrode and the interconnect structure is described as an in-situ interface because, due to the use of the reverse silicide process to form the in-situ interface from a chemical reaction, the surfaces that form the in-situ interface are substantially uncontaminated surfaces that have never been exposed to the ambient environment in which the IC structure is being formed (nor any other ambient environment). More specifically, in embodiments of the invention, the in-situ interface is an interface between a bottom surface of the MTJ bottom electrode and a top surface of the interconnect structure, and the bottom surface of the MTJ bottom electrode and the top surface of the interconnect structure that form the in-situ interface have not been exposed to an ambient. In general, because the MTJ is a somewhat fragile and sensitive element that must be carefully interfaced with other IC structures, the substantially uncontaminated in-situ interface that results from the novel reverse silicide process is a beneficial structure for interfacing the MTJ with other IC structures.

In embodiments of the invention, the MTJ stack is formed by depositing MTJ stack layers on the deposited semiconductor layer and the top surface of the MTJ bottom electrode. The MTJ stack layers are patterned and etched to form the MTJ stack positioned on the MTJ bottom electrode, and MTJ spacers are formed on sidewalls of the MTJ stack. The portions of the deposited semiconductor layer that did not participate in the reverse silicide process protect the underlying low-k ILD region/layer of the IC from the etching process that are used during formation of the MTJ stack and the MTJ spacers. The etching processes uses to form the MTJ stack can involve very aggressive ion beam etch (IBE)) processes that, without protection from the unreacted deposited semiconductor layer, would damage the underlying low-k ILD region/layer. Because of the protection provided by the unreacted deposited semiconductor layer, the underlying low-k ILD region/layer can remain substantially flat/planar. After formation of the MTJ stack and the MTJ spacers, the remaining unreacted portion of the deposited semiconductor layer is selectively removed and replaced with a conformally deposited liner that fills in the space that was occupied by the deposited semiconductor layer and assists with encapsulating the MTJ stack.

Turning now to a more detailed description of example embodiments of the invention, FIG. 1 depicts a portion of a multi-layered IC (or semiconductor wafer) 100 after an initial set of fabrication operations in accordance with aspects of the invention. The multi-layered IC 100 is depicted in two-dimensions (2D) extending along the y-axis and the x-axis. However, it is understood that the multi-layered IC 100 is a three-dimensional structure that also extends along the z-axis. Accordingly, any descriptions provided herein with reference to dimensions of the multi-layered IC 100 that extend along the x-axis and the y-axis (e.g., T1, W1) also include the corresponding dimension(s) that extends along the z-axis. The specifics of the dimension (s) that extends along the z-axis will depend on the specific type of feature. For example, the specific z-axis dimensions of the interconnect structures 142 will depend on whether the interconnect structures 142 are implemented as a line, a wire, a via, etc.

A variety of well-known fabrication operations are suitable for forming the multi-layered IC 100 to the fabrication stage shown in FIG. 1. Accordingly, in the interest of brevity, such well-known fabrication operations are either omitted or described and illustrated at a high level. At the fabrication stage shown in FIG. 1, suitable fabrication operations have been used to form a substrate 102 having MOL structures 110 and FEOL structures 120 formed therein or thereon. Fabrication operations such as wafer preparation, isolation, and gate patterning have been used to form FEOL structures 120, which can include structures such as wells, source/drain (S/D) regions, extension junctions, silicide regions, liners, and the like. The MOL structures 110 include contacts and other structures that couple to the active regions (e.g., gate/source/drain) of the FEOL structures 120. Networks of interconnect structures 142 (e.g., conductive lines, conductive wires, vias, and the like) have been formed in a low-k interlevel dielectric (ILD) layer/region 140 as part of the BEOL structures 130 formed during initial portions of the BEOL stage. The interconnect structures 142 can be copper (Cu), cobalt (Co), nickel (Ni), or any other suitable conductive material. The interconnect structures 142 can further include a barrier layer between the metal and the ILD. The barrier layer can be titanium nitride (TiN), tantalum nitride (TaN), ruthenium (Ru), hafnium nitride (HfN), niobium nitride (NbN), tungsten nitride (WN), tungsten carbon nitride (WCN), or combinations thereof, where the barrier layer can prevent diffusion and/or alloying of the metal contact fill material (used to form the interconnect structure 142) with a top source/drain material, and/or anode/cathode material. In embodiments of the invention, the barrier layer can be deposited by ALD, CVD, MOCVD, PECVD, or combinations thereof. In embodiments of the invention, the metal fill can be formed by ALD, CVD, and/or PVD. The interconnect structures 142 each have an initial thickness dimension of T1 and an initial width dimension of W1. In aspects of the invention, the ILD region 140 can be formed from any suitable dielectric material such as a silicon oxide, low-k dielectric (e.g., k (relative dielectric constant) less than about 4), an ultra-low-k (ULK) dielectric (e.g., k less than about 2.5), tetraethoxysilane (TEOS), black diamond III (BDIII), and the like, or any suitable combination of those materials.

Figure 2:
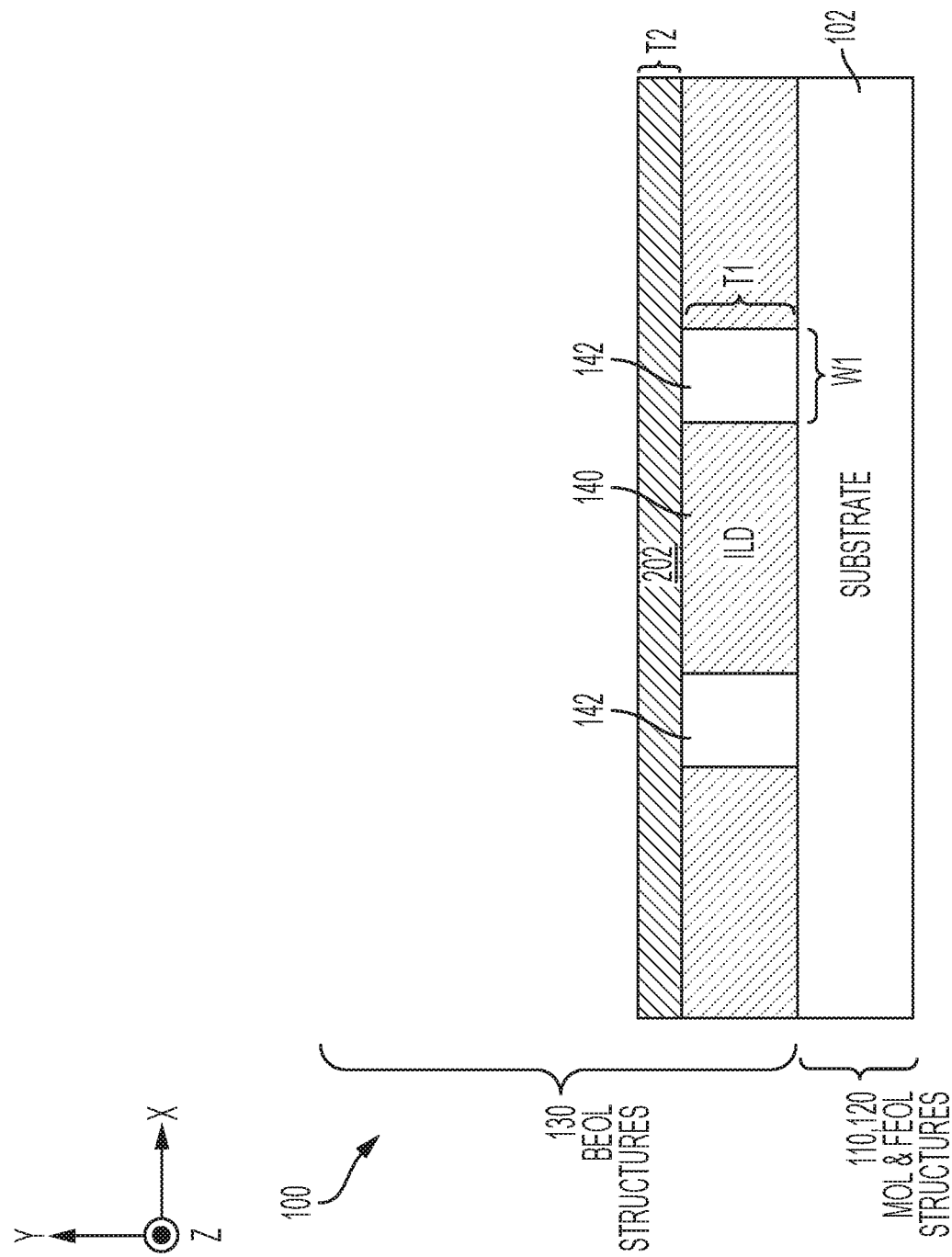

In FIG. 2, known semiconductor fabrication operations have been used to deposit a layer 202 formed from a semiconductor material. In the illustrated embodiments of the invention, the semiconductor material is amorphous Si (aSi). The semiconductor material used to form the layer 202 can be any other suitable semiconductor material including, for example, polycrystalline Si, germanium (Ge), silicon germanium (SiGe), and the like. In general, the semiconductor material can be Si, Ge, or SiGe. The phase of the semiconductor material can be amorphous or crystalline such as polycrystalline, or even conceptually single crystalline, for example, by bonding a single crystalline silicon layer with the starting structure shown in FIG. 1. In accordance with aspects of the invention, the aSi layer 202 is deposited over the ILD 140 and the interconnect structures 142, and the deposited aSi layer 202 has a thickness dimension T2. In embodiments of the invention, T2 is less than T1. In some embodiments of the invention, T2 can be about 10 nm. Any suitable fabrication process can be used to deposit the aSi layer 202, including for example a physical vapor deposition (PVD) process, a chemical vapor deposition (CVD) process, an atomic layer deposition (ALD) process.

Figure 3:
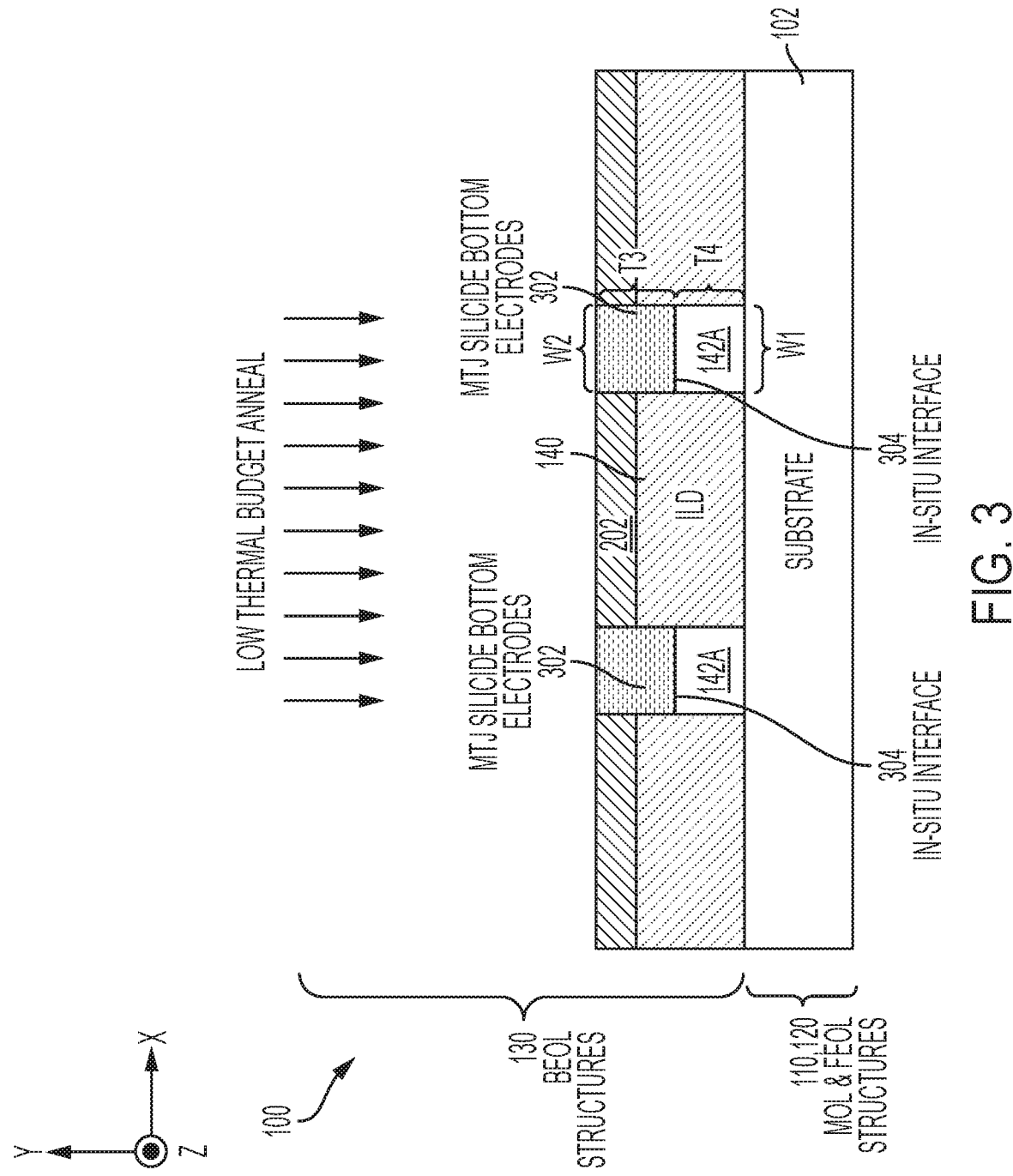

In FIG. 3, a reverse silicide process has been used to form MTJ bottom electrodes 302 and post-silicidation interconnect structures 142A in accordance with aspects of the invention. The MTJ bottom electrodes 302 each includes a thickness dimension T3 and a width dimension W2, and the post-silicidation interconnect structures 142A each includes a thickness dimension T4 and the width dimension W1. It is understood that, despite the use of the term "silicide," the reverse silicide process applies equally to situations where the semiconductor material is other than Si (e.g., Ge, SiGe, etc.). The reverse silicide process is initiated by applying a low thermal budget anneal. Unlike known silicide formation processes in which metal is deposited on silicon, the reverse silicide process described herein deposits an aSi layer 202 over both the metal interconnect structures 142 (shown in FIGS. 1 and 2) and the low-k ILD region 140. Accordingly, after the low thermal budget anneal of the reverse silicide process has been applied, the resulting MTJ bottom electrode 302 is self-aligned in that the chemical reaction between the aSi in the layer 202 and the metal in the interconnect structure 142 proceeds substantially in the portion of the aSi layer 202 that is over the interconnect structures 142, and does not substantially proceed in the portions of the aSi layer 202 that are over the low-k ILD 140. In some cases, the metal in the interconnect structure 142 can diffuse laterally to form silicide over the ILD 140 and around the interconnect structure 142. However, even in such cases, the silicide that is formed by the anneal is confined in the region around the metal interconnect structure 142. Thus, the reverse silicide process in accordance with aspects of the present invention is highly selective to and self-aligned with the footprint of the underlying interconnect structures 142. The low thermal budget anneal process can be a low temperature anneal process with a long anneal time (e.g., below 450° C. for a time period between 30 seconds to 30 minutes), a high temperature anneal with a short anneal time (e.g., rapid thermal anneal, laser anneal or flash anneal with a temperature ranging from 750° C. to 1000° C., with an anneal time ranging from 0.5 millisecond to 0.5 second), or a combination of multiple low thermal budget anneal processes.

In embodiments of the invention, the MTJ bottom electrode 302 is a compound/alloy formed from a combination of the aSi from the layer 202 and the metal from the interconnect structures 142 (shown in FIGS. 1 and 2). More specifically, the low thermal budget anneal of the reverse silicide process causes at least some of the aSi of the layer 202 to diffuse into and react with the metal of the interconnect structure 142, while also, in some instances, causing at least some of the metal of the interconnect structure 142 to diffuse into and react with the aSi of the layer 202. To form silicide, it is only necessary to have either silicon or metal diffusion, for example, either metal diffusion into silicon, or silicon diffusion into metal. In some silicide formation operations, there is both metal and silicon diffusion. In embodiments of the invention, the layer 202 can be any suitable semiconductor material, including but not limited to aSi, polysilicon Si, Ge, and SiGe. In embodiments of the invention, the interconnect structure 142 can be any suitable metal, including but not limited to Co and Cu. Accordingly, in embodiments of the invention, the MTJ bottom electrode 302 that results from the low thermal budget anneal can be any suitable semiconductor/metal alloy/compound, including but not limited to a silicide (e.g., CoSi or CuSi), a germanide, and combinations thereof.

In embodiments of the invention, the reverse silicide process is self-limited and will continue until either all of the metal in the interconnect structures 142 is consumed or until all of the aSi in the portion of the layer 202 that is positioned over the metal interconnect structures 142 is consumed. In aspects of the invention, the thickness T2 of the layer 202 is considerably less than the thickness T1 of the interconnect structures 142. Accordingly, after the reverse silicide process is initiated by the low thermal budget anneal, the aSi/metal reaction of the reverse silicide process stops when the aSi in the portion of the layer 202 that is positioned over the metal interconnect structures 142 is consumed. Consequently, while the lateral/width dimensions W2 of the MTJ bottom electrodes 302 that result from the novel reverse silicide process are determined by the footprint of the underlying interconnect structures 142, the thickness dimensions T3 of the MTJ bottom electrode 302 that results from the novel reverse silicide process can be tuned by adjusting the thickness T2 of the aSi layer 202.

Additionally, in practice, the portion of the MTJ bottom electrode 302 that is surrounded by the aSi layer 202 can have a different width dimension W2 than the portion of the bottom electrode 302 that is surrounded by the ILD 140. In the portion of the bottom electrode 302 that is surrounded by the ILD 140, in the case that the aSi/metal reaction is dominated by the diffusion of Si into the metal of the interconnect structure 142, the aSi/metal reaction does not substantially spread, and W2 in this region of the electrode 302 is substantially the same as W1. However, in the case that the aSi/metal reaction is dominated by the diffusion of metal into the aSi layer 202, the aSi/metal reaction can extend into portions of the layer 202 that are not over the interconnect structure 140, which results in W2 in this region of the electrode 302 being larger than W1. The potential for variations in W2 along the y-axis of the bottom electrode 302, however, does not have a negative impact on the performance of the bottom electrode 302 fabricated in accordance with aspects of the invention, nor do such variations have a negative impact on the performance the associated MTJ stacks 402A, 402B (shown in FIGS. 5A, 5B).

As also shown in FIG. 3, the interface between the MTJ bottom electrodes 302 and the interconnect structures 142A is described as an in-situ interface 304 because, due to the use of the reverse silicide process to form the in-situ interface 304 from a chemical reaction, the surfaces that form the in-situ interface 304 are substantially uncontaminated surfaces that have never been exposed to the ambient environment in which the IC structure 100 is being fabricated. More specifically, in embodiments of the invention, the in-situ interface 304 is an interface between a bottom surface of the MTJ bottom electrode 302 and a top surface of the post-silicide interconnect structure 142A, and the bottom surface of the MTJ bottom electrode 302 and the top surface of the interconnect structure 142 that form the in-situ interface 304 have not been exposed to an ambient. In general, because the MTJ stacks 402A, 402B (shown in FIGS. 5A, 5B) are somewhat fragile and sensitive elements that must be carefully interfaced with other IC structures (e.g., post-silicide interconnects 142A), the substantially uncontaminated in-situ interface 304 that results from the novel reverse silicide process is a beneficial structure for interfacing the MTJ stacks 402A, 402B with other structures of the IC 100.

Figure 4:
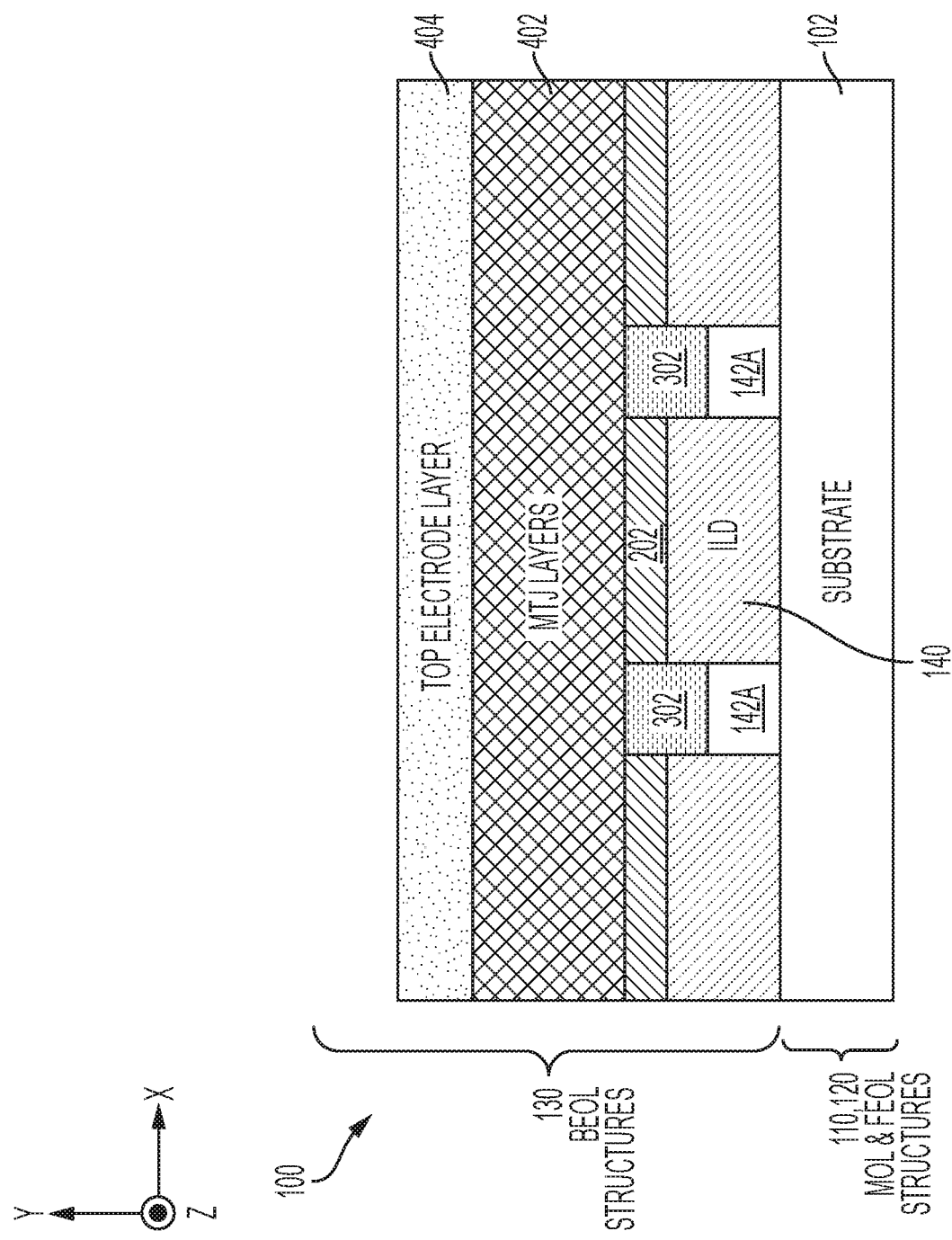

In FIG. 4, known semiconductor fabrication operations have been used to deposit MTJ stack layers 402 and a top electrode layer 404, configured and arranged as shown. A wide variety of layers and elements (e.g., an MTJ cap, multiple free/reference layers, etc.) can be included in the MTJ stack layers 402. The top electrode 404 can be any suitable conductive material, including but not limited to TaN.

FIGS. 5A, 6A, 7A, and 8A depict operations used to complete the fabrication and encapsulation of the MTJ stack 402A, wherein the MTJ stack 402A is wider than the underling MJT bottom electrode 302 in accordance with aspects of the invention. FIGS. 5B, 6B, 7B, and 8B depict operations used to complete the fabrication and encapsulation of the MTJ stack 402B, wherein the MTJ stack 402B is narrower than the underling MJT bottom electrode 302 in accordance with aspects of the invention. The wider MTJ stack 402A provides more precise control over the fabrication of the MTJ stack 402A at the expense of a lower density of MTJ elements on the IC structure 100A. Conversely, the narrower MTJ stack 402B provides less precise control over the fabrication of the MTJ stack 402B but allows for a greater density of MTJ elements on the IC structure 100B.

Figure 5A:
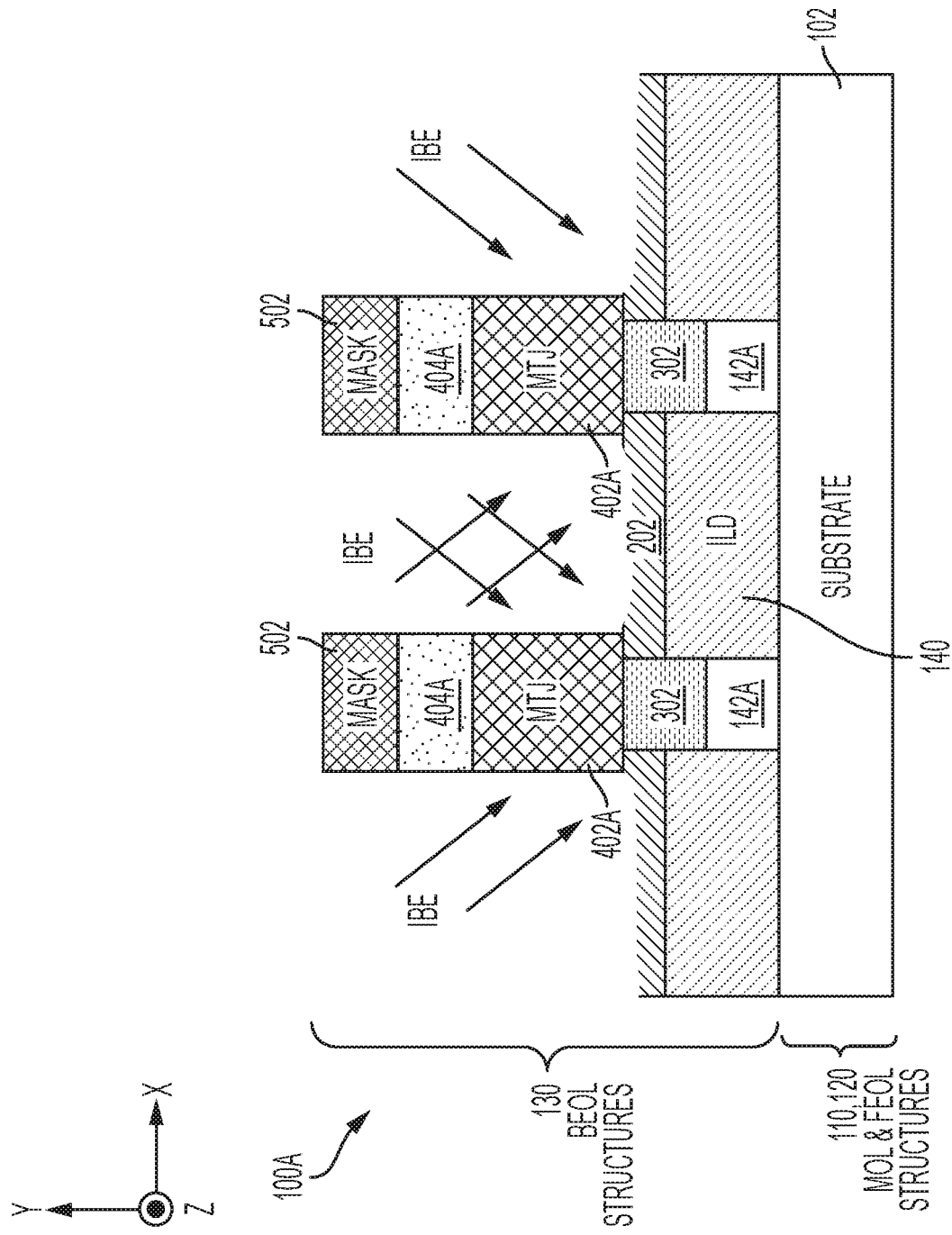
FIG. 5A depicts a cross-sectional view of a semiconductor wafer after fabrication operations according to embodiments of the invention.

In FIG. 5A, known fabrication operations have been used to deposit a mask 502 over the top electrode layer 404 (shown in FIG. 4). The mask 502 has been transferred to the top electrode layer 404 and the MTJ stack layers 402 (shown in FIG. 4) through etching to form the top electrodes 404A and the MTJ stacks 402A. In accordance with aspects of the invention, the MTJ stack 402A is wider than the underling MJT bottom electrode 302. In embodiments of the invention, the MTJ stack layers 402 are etched using an aggressive IBE processes that, without protection from the unreacted deposited semiconductor layer 202, would damage the underlying low-k ILD region 140. Because of the protection provided by the unreacted deposited semiconductor layer 202, the underlying low-k ILD region 140 can remain substantially flat/planar. The mask 502 can be a softmask material such as photoresist, a hardmask material such as silicon oxide, or any other suitable material or combination of any suitable materials.

Figure 5B:
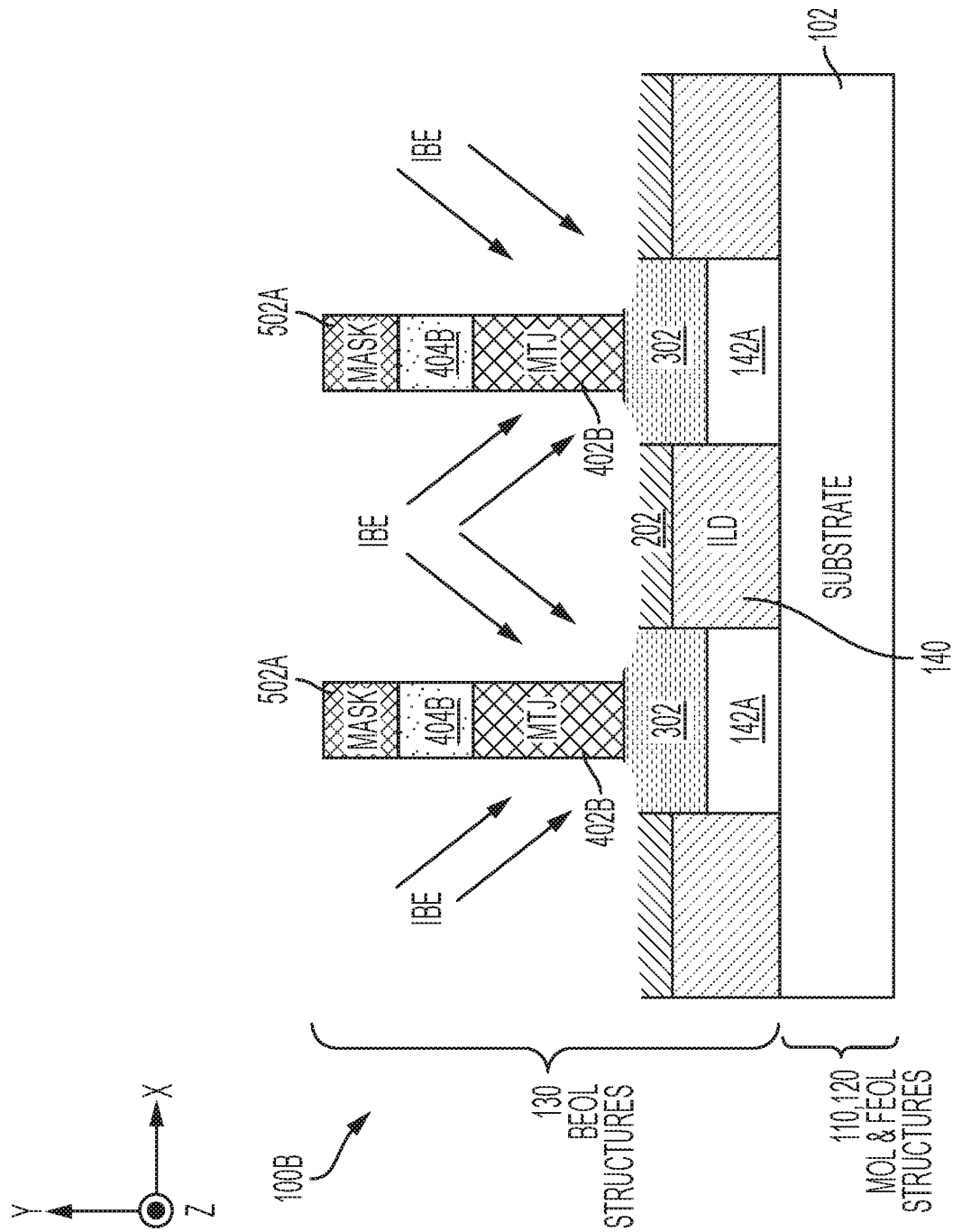
FIG. 5B depicts a cross-sectional view of a semiconductor wafer after fabrication operations according to embodiments of the invention.

In FIG. 5B, known fabrication operations have been used to deposit a mask 502A over the top electrode layer 404 (shown in FIG. 4). The mask 502A has been transferred to the top electrode layer 404 and the MTJ stack layers 402 (shown in FIG. 4) through etching to form the top electrodes 404B and the MTJ stacks 402B. In accordance with aspects of the invention, the MTJ stack 402B is narrower than the underling MJT bottom electrode 302. In embodiments of the invention, the MTJ stack layers 402B are etched using an aggressive IBE processes that, without protection from the unreacted deposited semiconductor layer 202, would damage the underlying low-k ILD region 140. Because of the protection provided by the unreacted deposited semiconductor layer 202, the underlying low-k ILD region 140 can remain substantially flat/planar. Additionally, the IBE process can damage exposed top surfaces of the MTJ bottom electrodes 302, which does not have a negative impact on the performance of the bottom electrodes 302.

Figure 6A:
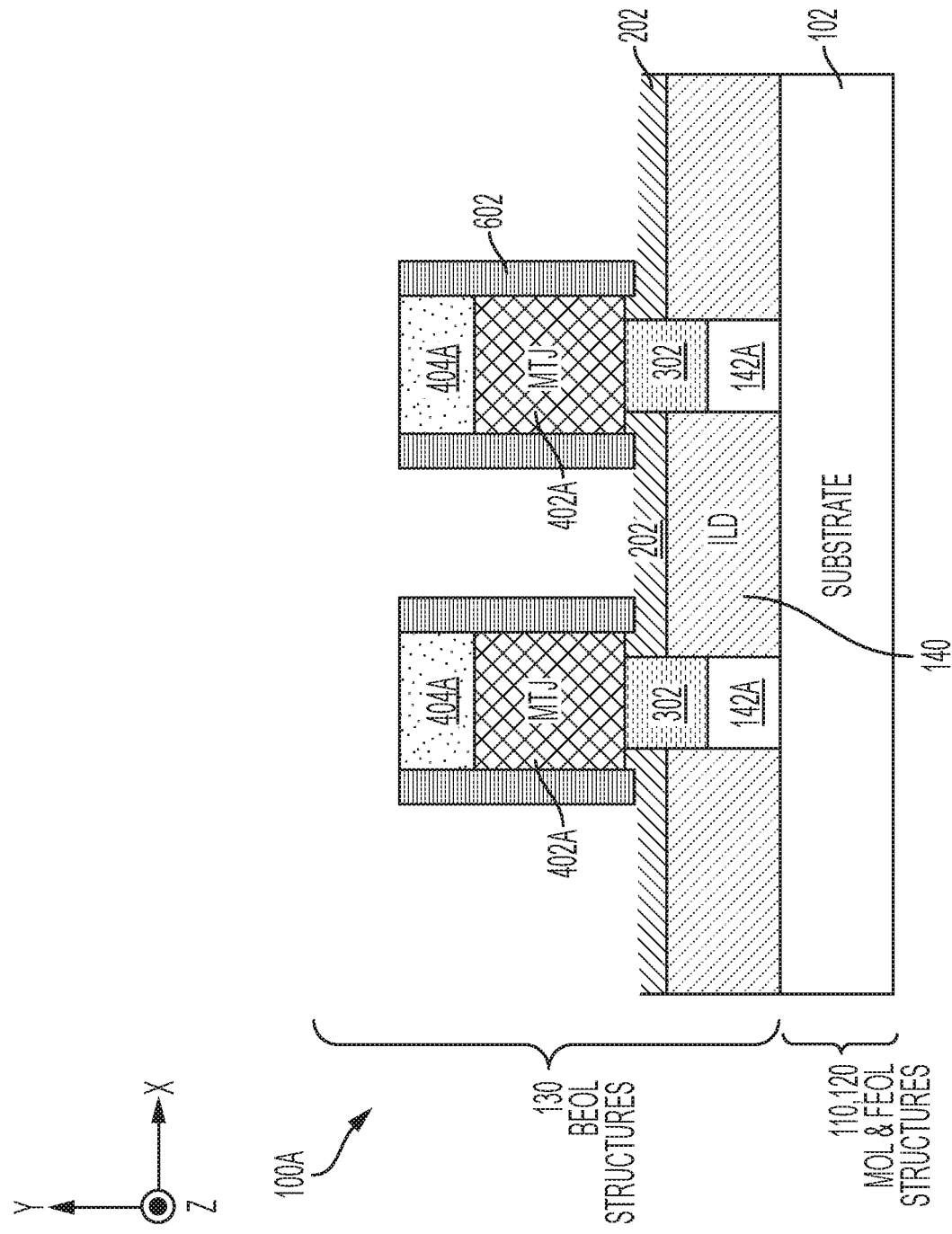
FIG. 6A depicts a cross-sectional view of a semiconductor wafer after fabrication operations according to embodiments of the invention.

In FIG. 6A, known semiconductor fabrication operations have been used to form encapsulating spacers 602 around the MTJ stacks 402A and the top electrodes 404A. Any suitable fabrication process can be used to form the spacers 602. In aspects of the invention, the spacers 602 can be formed from any suitable dielectric material (e.g., silicon nitride), which can include other elements such as Si, C, N, 0, and the like. The mask layer 502 can be removed by any suitable etching process. The encapsulating spacers can be formed by deposition followed by directional etch (e.g., reactive ion etch (RIE)).

Figure 6B:
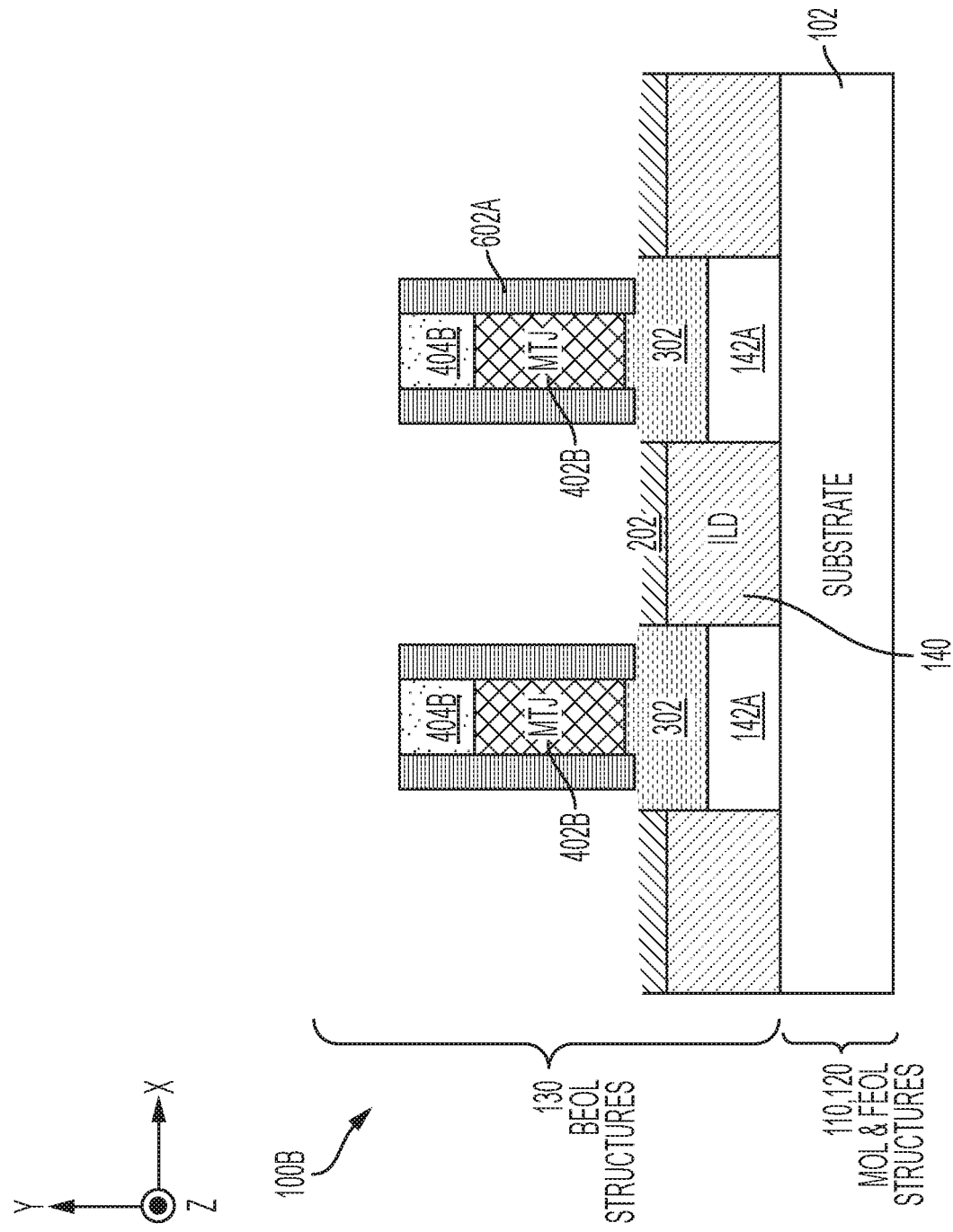
FIG. 6B depicts a cross-sectional view of a semiconductor wafer after fabrication operations according to embodiments of the invention.

In FIG. 6B, known semiconductor fabrication operations have been used to form encapsulating spacers 602A around the MTJ stacks 402B and the top electrodes 404B. Any suitable fabrication process can be used to form the spacers 602A. In aspects of the invention, the spacers 602A can be formed from any suitable dielectric materials (e.g., silicon nitride), which can include other elements such as Si, C, N, 0, and the like. The mask layer 502A can be removed by any suitable etching process.

Figure 7A:
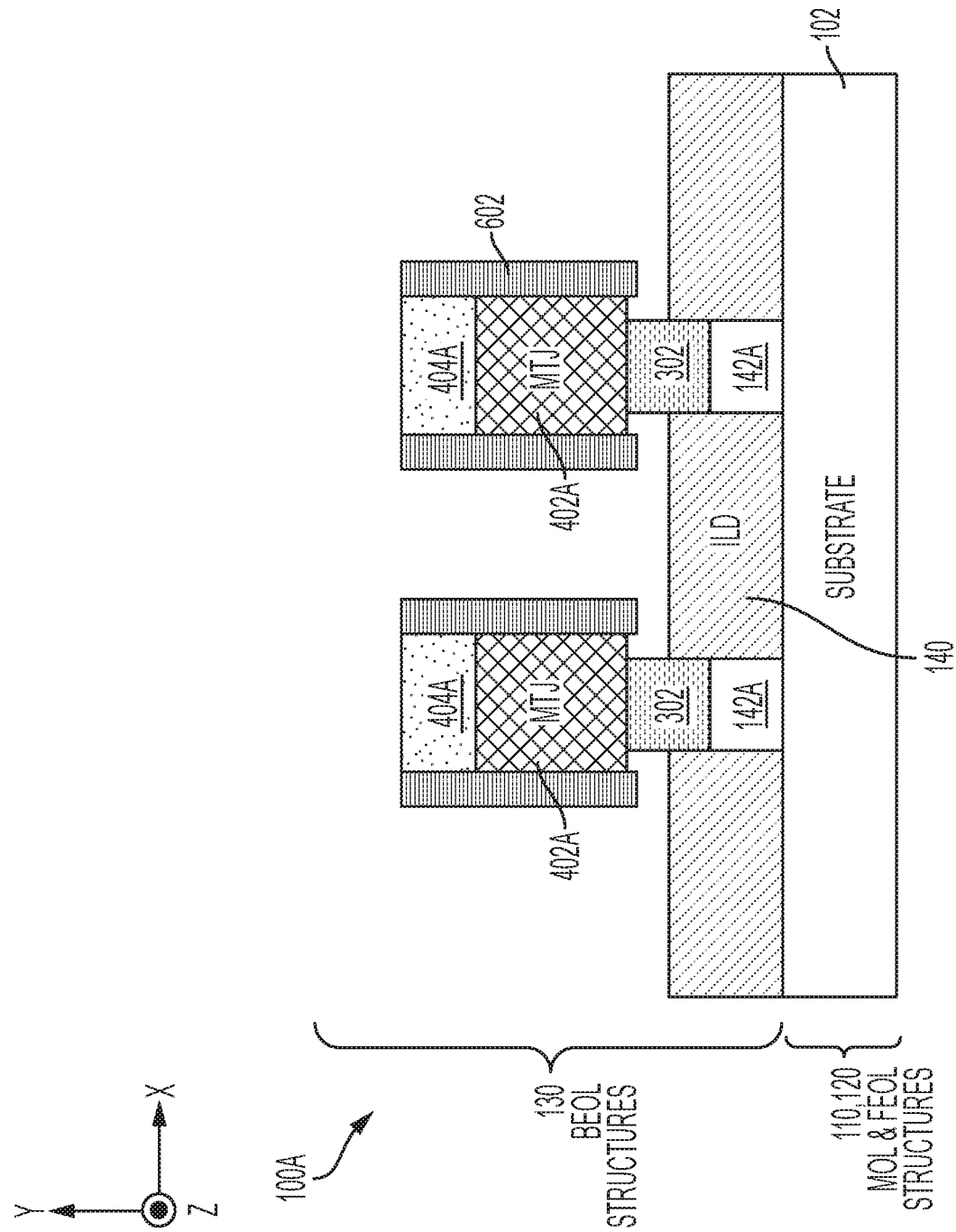
FIG. 7A depicts a cross-sectional view of a semiconductor wafer after fabrication operations according to embodiments of the invention.
Figure 7B:
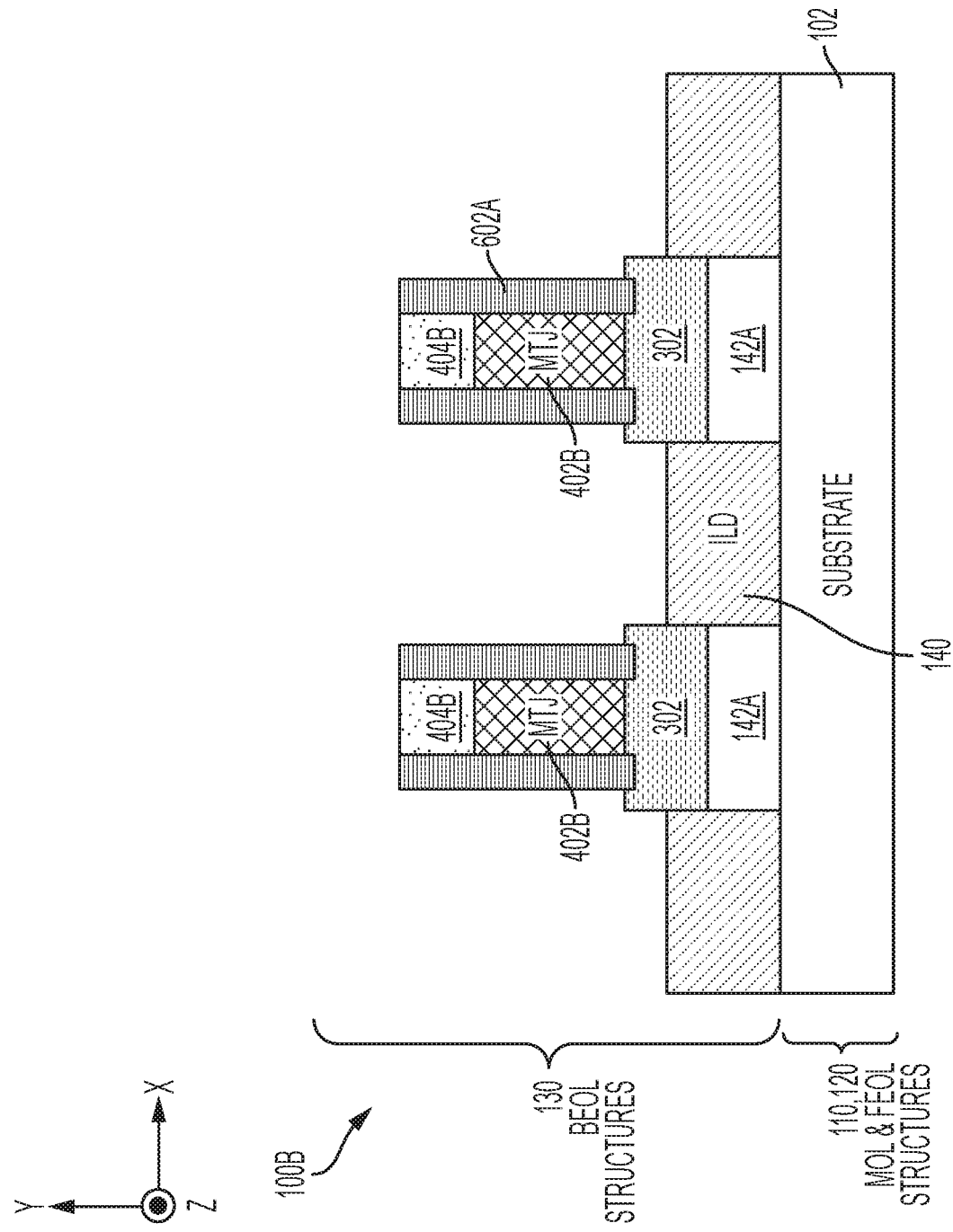
FIG. 7B depicts a cross-sectional view of a semiconductor wafer after fabrication operations according to embodiments of the invention.

In FIG. 7A and in FIG. 7B, known semiconductor fabrication operations (e.g., an aqueous etch containing ammonia, or a dry etch process containing SF6, to remove aSi) have been used selectively removing the remaining unreacted and damaged portions of the aSi layer 202, thereby exposing portions of the ILD 140 and the bottom electrode 302.

Figure 8A:
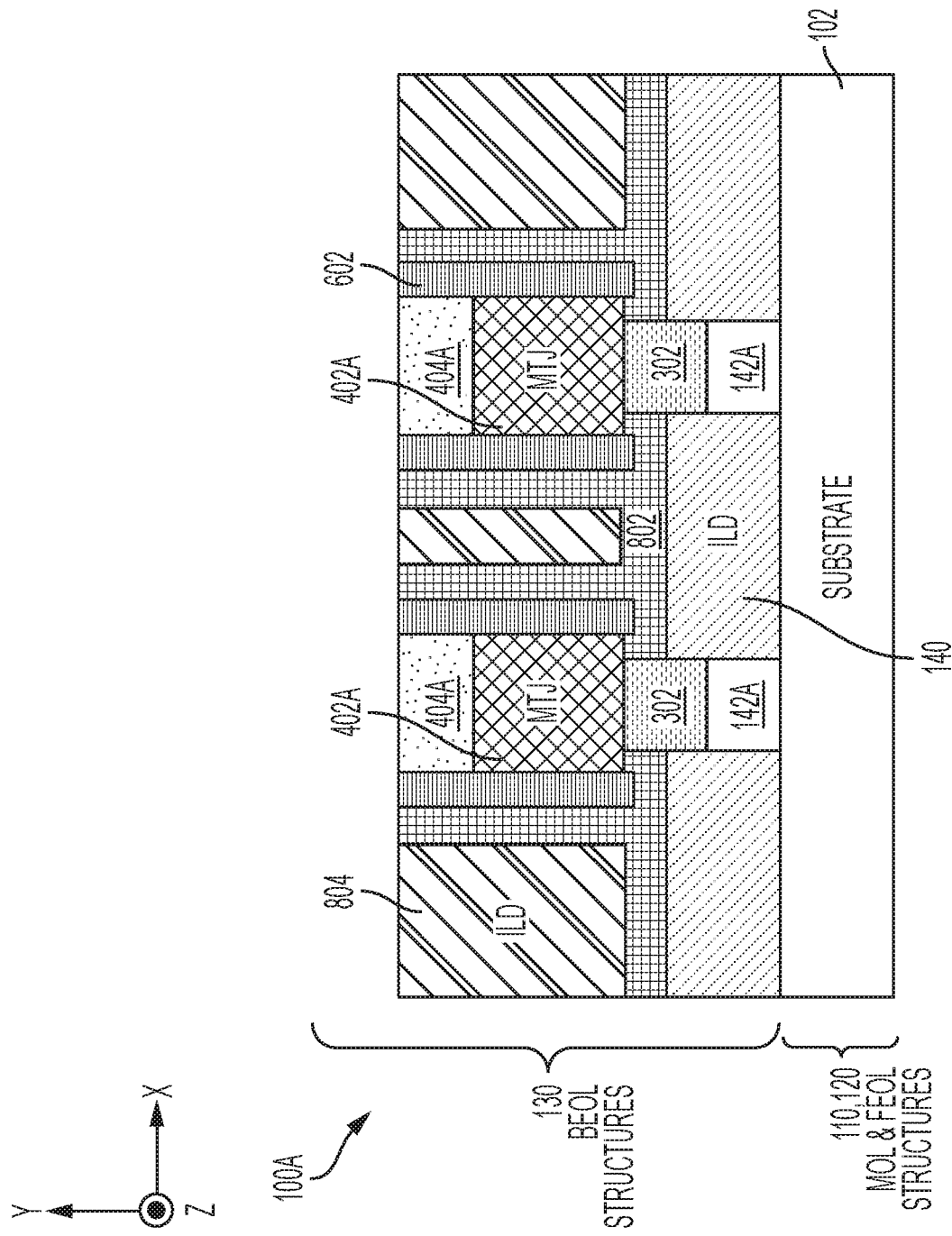
FIG. 8A depicts a cross-sectional view of a semiconductor wafer after fabrication operations according to embodiments of the invention.

In FIG. 8A, known semiconductor fabrication operations have been used deposit an encapsulating liner 802 in the space that was occupied by the aSi layer 202, as well as along exposed sidewalls of the encapsulating spacers 602. Any suitable fabrication process can be used to form the liner 802, including, for example, an ALD or a CVD process. The encapsulating liner 802 can include any suitable dielectric material, including but not limited to, SiCN, SiBCN, SiOCN, AlN, SiN. Known fabrication operations have also been used to deposit and planarize (e.g., using CMP) an ILD region 804. In aspects of the invention, the ILD region 804 can be formed from a low-k dielectric (e.g., k less than about 4), an ultra-low-k (ULK) dielectric (e.g., k less than about 2.5), tetraethoxysilane (TEOS), black diamond III (BDIII), and the like.

Figure 8B:
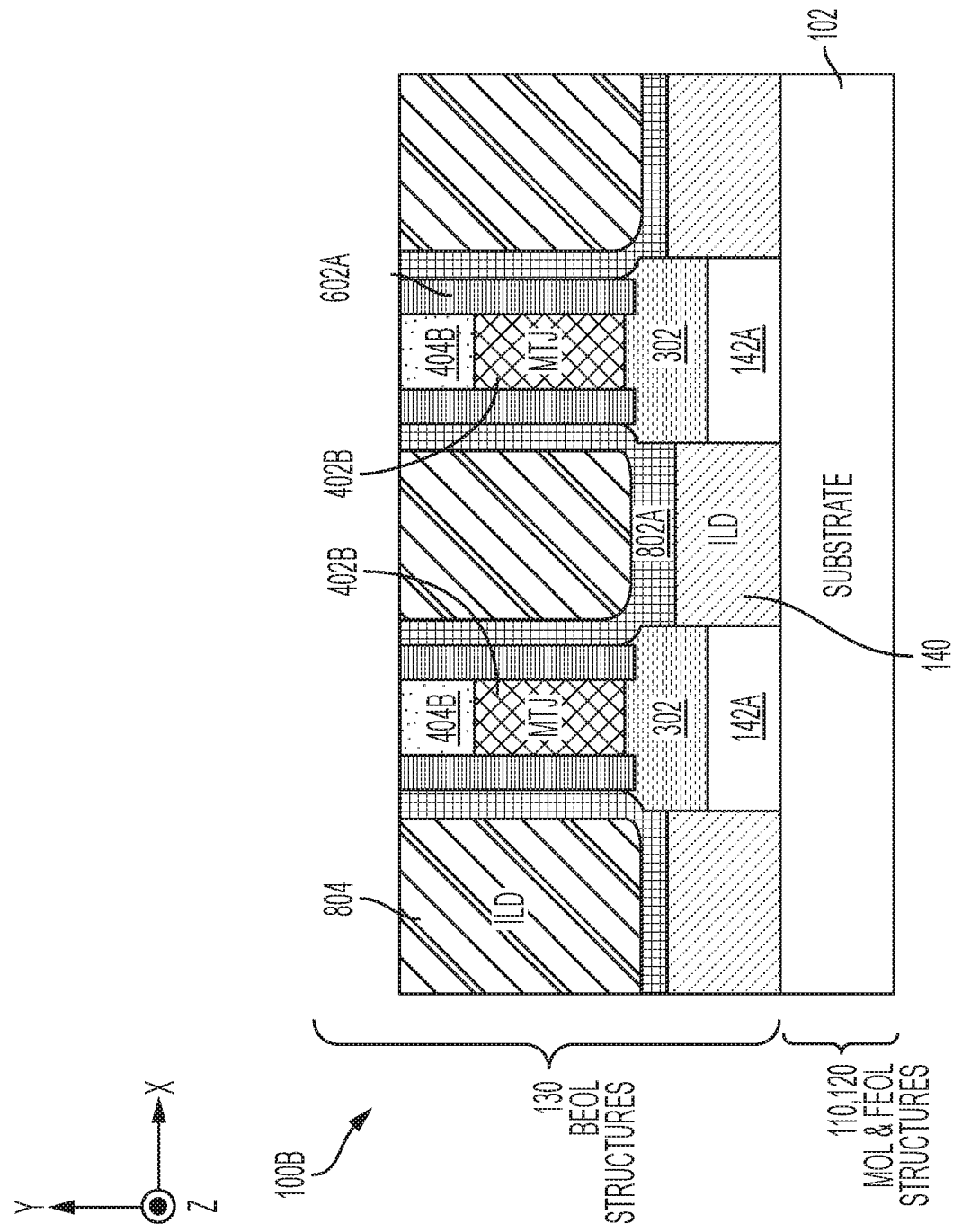

In FIG. 8B, known semiconductor fabrication operations have been used deposit an encapsulating liner 802A in the space that was occupied by the aSi layer 202, as well as along exposed sidewalls of the encapsulating spacers 602A. Any suitable fabrication process can be used to form the liner 802A, including, for example, an ALD or a CVD process. The encapsulating liner 802 can include any suitable dielectric material, including but not limited to, SiCN, SiBCN, SiOCN, AlN, SiN. Known fabrication operations have also been used to deposit and planarize (e.g., using CMP) an ILD region 804. In aspects of the invention, the ILD region 804 can be formed from a low-k dielectric (e.g., k less than about 4), an ultra-low-k (ULK) dielectric (e.g., k less than about 2.5), tetraethoxysilane (TEOS), black diamond III (BDIII), and the like.

The methods described herein can be used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a bottom electrode of a magnetic tunnel junction (MTJ) storage element, the method comprising:
   forming the bottom electrode of the MTJ storage element such that the bottom electrode is communicatively coupled to an interconnect structure through an in-situ interface;
   wherein the in-situ interface comprises an interface between a bottom surface of the bottom electrode and a top surface of the interconnect structure;
   wherein a top surface of the bottom electrode is configured to couple to a bottom end of a MTJ stack; and
   wherein the bottom electrode comprises an alloy comprising a semiconductor and a metal.

2. The method of claim 1, wherein the in-situ interface results from a chemical reaction between the interconnect structure and a semiconductor material deposited over the interconnect structure.

3. The method of claim 2, wherein the chemical reaction results from performing an anneal operation.

4. The method of claim 3, wherein forming the bottom electrode comprises the anneal operation.

5. The method of claim 4, wherein:
   the interconnect structure comprises an interconnect structure metal; and
   the anneal operation causes:
      at least some of the semiconductor material to diffuse into the interconnect structure metal; or
      at least some of the interconnect structure metal to diffuse into the semiconductor material.

6. The method of claim 5, wherein the semiconductor material is selected from the group consisting of amorphous Si, Si, Ge, and SiGe.

7. The method of claim 6, wherein the interconnect structure metal is selected from the group consisting of Co and Cu.

8. A method of forming a bottom electrode of a magnetic tunnel junction (MTJ) storage element, the method comprising:
   depositing a layer of semiconductor material over an exposed surface of a layer of a multi-layered integrated circuit (IC) and an exposed surface of an interconnect structure in the layer of the multi-layered IC;
   wherein the interconnect structure comprises an interconnect structure metal; and forming the bottom electrode of the MTJ storage element by initiating a self-aligned chemical reaction between the interconnect structure metal and a portion of the layer of semiconductor material that is over the exposed surface of the interconnect structure;

wherein a top surface of the bottom electrode is configured to couple to a bottom end of a MTJ stack; and wherein the bottom electrode comprises an alloy comprising a semiconductor and a metal.

9. The method of claim 8, wherein the self-aligned chemical reaction results from performing an anneal operation.

10. The method of claim 9, wherein the anneal operation causes:

at least some of the portion of the layer of semiconductor material that is over the exposed surface of the interconnect structure to diffuse into the interconnect structure metal; or at least some of the interconnect structure metal to diffuse into the portion of the layer of semiconductor material that is over the exposed surface of the interconnect structure.

11. The method of claim 10, wherein the semiconductor material of the layer of semiconductor material is selected from the group consisting of amorphous Si, Si, Ge, and SiGe.

12. The method of claim 11, wherein the interconnect structure metal is selected from the group consisting of Co and Cu.

13. The method of claim 11 further comprising:

depositing MTJ stack layers over the layer of semiconductor material and the bottom electrode;

forming a pattern on the MTJ stack layers; and removing portions of the MTJ stack layers that are not covered by the pattern;

wherein a remaining portion of the MTJ stack layers comprises the MTJ stack; and wherein the MTJ stack is positioned such that the bottom end of the MTJ stack is communicatively coupled to the top surface of the bottom electrode.

14. The method of claim 13, wherein the layer of semiconductor material protects a portion of the layer of the multi-layered IC from being damaged by a process used to remove the portions of the MTJ stack layers that are not covered by the pattern.

15. The method of claim 14, wherein the process used to remove the portions of the MTJ stack layers that are not covered by the pattern comprises an ion beam etch (IBE) process.

16. The method of claim 14 further comprising, subsequent to removing the portions of the MTJ stack layers that are not covered by the pattern, removing the layer of semiconductor material.

17. The method of claim 16 further comprising depositing a dielectric liner material over exposed portions of the portion of the layer of the multi-layered IC, exposed portions of the bottom electrode, and exposed portions of the MTJ stack.

18. A bottom electrode structure of a magnetic tunnel junction (MTJ) storage element, the bottom electrode structure comprising:

a bottom electrode communicatively coupled to an interconnect structure through an in-situ interface;

wherein the in-situ interface comprises an interface between a bottom surface of the bottom electrode and a top surface of the interconnect structure;

wherein the bottom surface of the bottom electrode and the top surface of the interconnect structure that form the in-situ interface have not been exposed to an ambient environment;

wherein a top surface of the bottom electrode is configured to couple to a bottom end of a MTJ stack; and wherein the bottom electrode comprises an alloy comprising a semiconductor and a metal.

19. The structure of claim 18, wherein the semiconductor is selected from the group consisting of Si, amorphous Si, Ge, and SiGe.

20. The structure of claim 19, wherein the interconnect structure comprises an interconnect structure metal selected from the group consisting of Co and Cu.

* * * * *